US012300706B2

(12) United States Patent
Kono

(10) Patent No.: US 12,300,706 B2
(45) Date of Patent: May 13, 2025

(54) APPARATUS, SYSTEM, MOVING BODY, AND SUBSTRATE

(71) Applicant: CANON KABUSHIKI KAISHA, Tokyo (JP)

(72) Inventor: Shoji Kono, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 712 days.

(21) Appl. No.: 17/524,652

(22) Filed: Nov. 11, 2021

(65) Prior Publication Data

US 2022/0157868 A1 May 19, 2022

(30) Foreign Application Priority Data

Nov. 18, 2020 (JP) ................................. 2020-191392

(51) Int. Cl.
*H01L 27/146* (2006.01)
*H04N 25/75* (2023.01)
*H04N 25/78* (2023.01)

(52) U.S. Cl.
CPC .. *H01L 27/14605* (2013.01); *H01L 27/14621* (2013.01); *H01L 27/14623* (2013.01); *H01L 27/14627* (2013.01); *H01L 27/14636* (2013.01); *H01L 27/14645* (2013.01); *H04N 25/75* (2023.01)

(58) Field of Classification Search
CPC ......... H01L 27/14605; H01L 27/14621; H01L 27/14623; H01L 27/14627; H01L 27/14636; H01L 27/14645; H01L 27/14612; H04N 25/75; H04N 25/78
See application file for complete search history.

(56) References Cited

U.S. PATENT DOCUMENTS

2018/0269245 A1 9/2018 Mlinar
2021/0074745 A1* 3/2021 Mi ......................... H04N 25/47

FOREIGN PATENT DOCUMENTS

JP 2015179701 A * 10/2015
JP 2015216186 A 12/2015
JP 2015220716 A 12/2015
JP 2019192802 A 10/2019

OTHER PUBLICATIONS

JP_2015179701_A_I-FIT (Year: 2015).*
JP-2015179701-A English (Year: 2015).*

* cited by examiner

*Primary Examiner* — Yara B Green
*Assistant Examiner* — Akhee Sarker-Nag
(74) *Attorney, Agent, or Firm* — Canon U.S.A., Inc. IP Division

(57) ABSTRACT

An apparatus including a pixel area including a plurality of pixels arranged in the pixel area, the apparatus includes a first pixel of the plurality of pixels, and a second pixel arranged at a position closer to an edge of the pixel area than the first pixel, wherein each of the first pixel and the second pixel includes a first conversion unit, a second conversion unit surrounding the first conversion unit, and a transistor area provided with a circuit configured to process a signal based on a charge generated in the first conversion unit and the second conversion unit, and wherein a planar distance between the first conversion unit and the transistor area in the second pixel is longer than a planar distance between the first conversion unit and the transistor area in the first pixel.

21 Claims, 14 Drawing Sheets

LIGHT FROM LENS

1001
LENS
1002
DIAPHRAGM
1003
IMAGING DEVICE
1004
SIGNAL PROCESSING UNIT
1007
TIMING GENERATION UNIT
1008
GENERAL CONTROL/ CALCULATION UNIT
1009
MEMORY UNIT
1010
RECORDING MEDIUM CONTROL I/F UNIT
1011
RECORDING MEDIUM
1012
EXTERNAL I/F UNIT
1013
COMPUTER

APPARATUS, SYSTEM, MOVING BODY, AND SUBSTRATE

BACKGROUND OF THE DISCLOSURE

Field of the Disclosure

The aspect of the embodiments relates to a photoelectric conversion apparatus, a photoelectric conversion system provided with the photoelectric conversion apparatus, and a moving body.

Description of the Related Art

United States Patent Application Publication No. 2018/0269245 discusses a method for expanding a dynamic range of a photoelectric conversion apparatus by combining signals of two photoelectric conversion units where one of the photoelectric conversion units has a larger light receiving area and is placed to surround the other of the photoelectric conversion units.

In a pixel area including a plurality of pixels each including two photoelectric conversion units having substantially the same optical center, incident light is not concentrated on the center of a pixel (a photoelectric conversion unit having a smaller light receiving area) in pixels in a pixel area outer edge portion, and thus, shading (decrease in amount of light) occurs.

SUMMARY OF THE DISCLOSURE

According to an aspect of the embodiments, an apparatus including a pixel area including a plurality of pixels arranged in the pixel area, the apparatus includes a first pixel of the plurality of pixels, and a second pixel arranged at a position closer to an edge of the pixel area than the first pixel, wherein each of the first pixel and the second pixel includes a first conversion unit, a second conversion unit surrounding the first conversion unit, and a transistor area provided with a circuit configured to process a signal based on a charge generated in the first conversion unit and the second conversion unit, and wherein a planar distance between the first conversion unit and the transistor area in the second pixel is longer than a planar distance between the first conversion unit and the transistor area in the first pixel.

According to another aspect of the embodiments, an apparatus includes a plurality of pixels, wherein the plurality of pixels includes a pixel on which concentrated light is incident obliquely, the pixel including a first conversion unit and a second conversion unit surrounding the first conversion unit, and wherein a first center of the first conversion unit is eccentric with respect to a second center of the second conversion unit so that the first conversion unit receives a larger amount of light than an amount of light received by the first conversion unit in a case where the second center coincides with the first center.

Further features of the disclosure will become apparent from the following description of exemplary embodiments with reference to the attached drawings.

DESCRIPTION OF THE EMBODIMENTS

A photoelectric conversion apparatus and a method of driving the photoelectric conversion apparatus according to a first exemplary embodiment of the disclosure will be described with reference to FIGS. 1 to 12.

Figure 1:
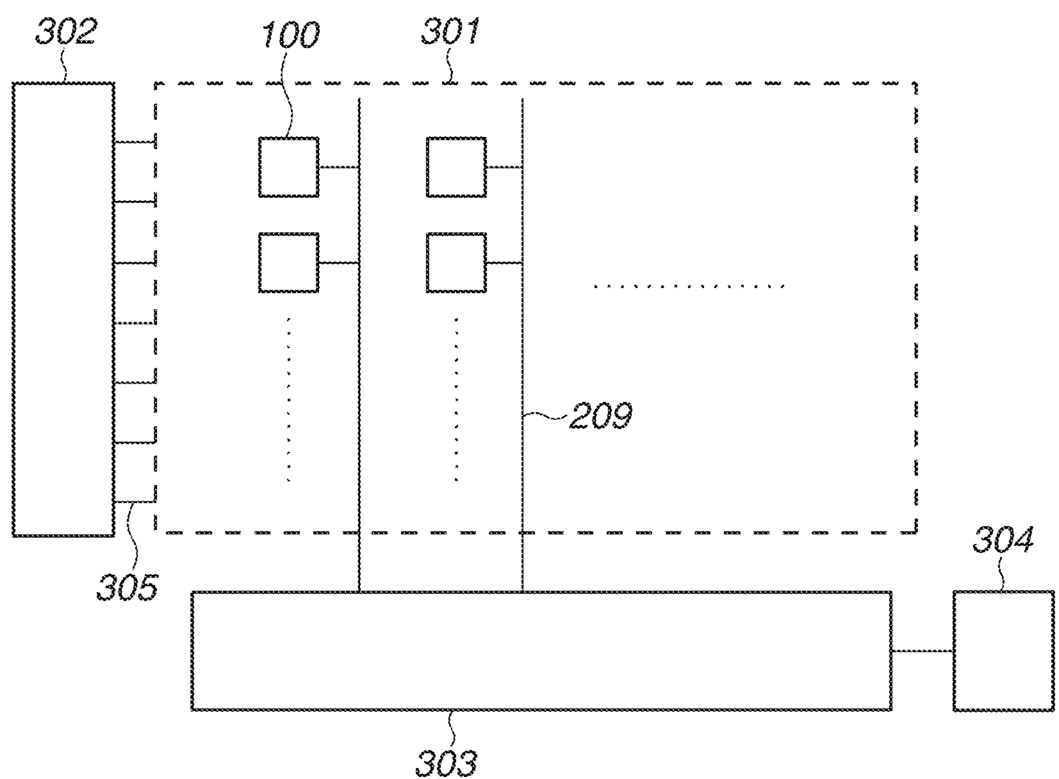
FIG. 1 is a schematic diagram illustrating a photoelectric conversion apparatus according to a first exemplary embodiment.
Figure 2:
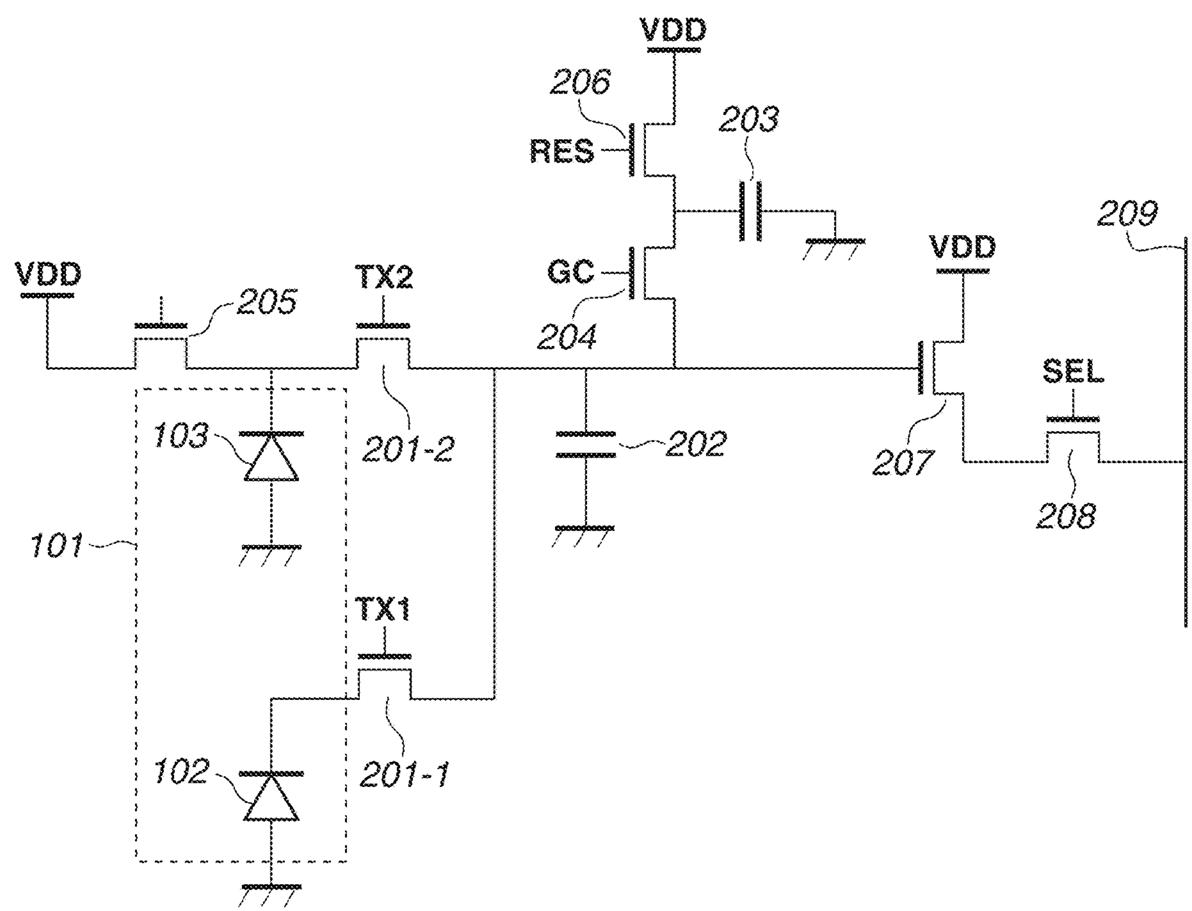
FIG. 2 is a diagram illustrating an example of a configuration of a pixel circuit of the photoelectric conversion apparatus according to the first exemplary embodiment.
Figure 3:
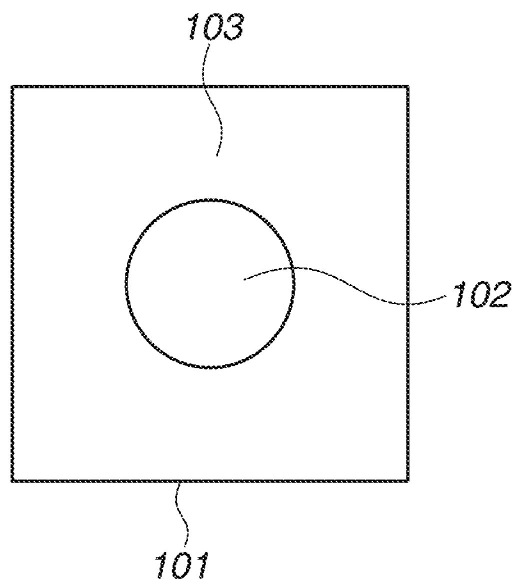
FIG. 3 is a diagram schematically illustrating a planar structure of the photoelectric conversion apparatus according to the first exemplary embodiment.
Figure 4:
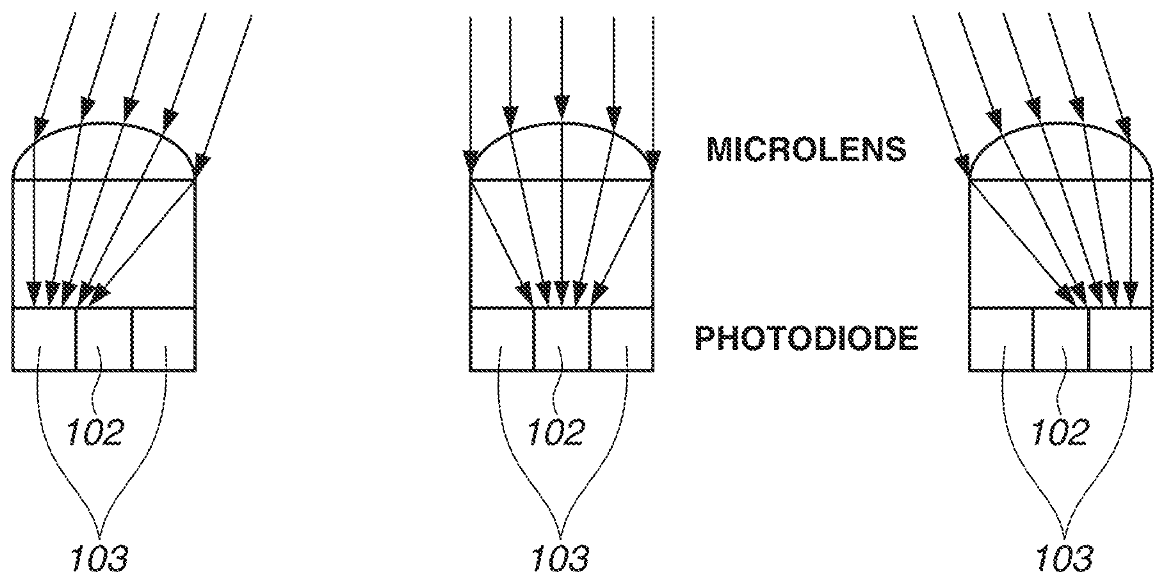
FIG. 4 is a diagram schematically illustrating light concentration of a microlens in a pixel area according to the first exemplary embodiment.
Figure 5:
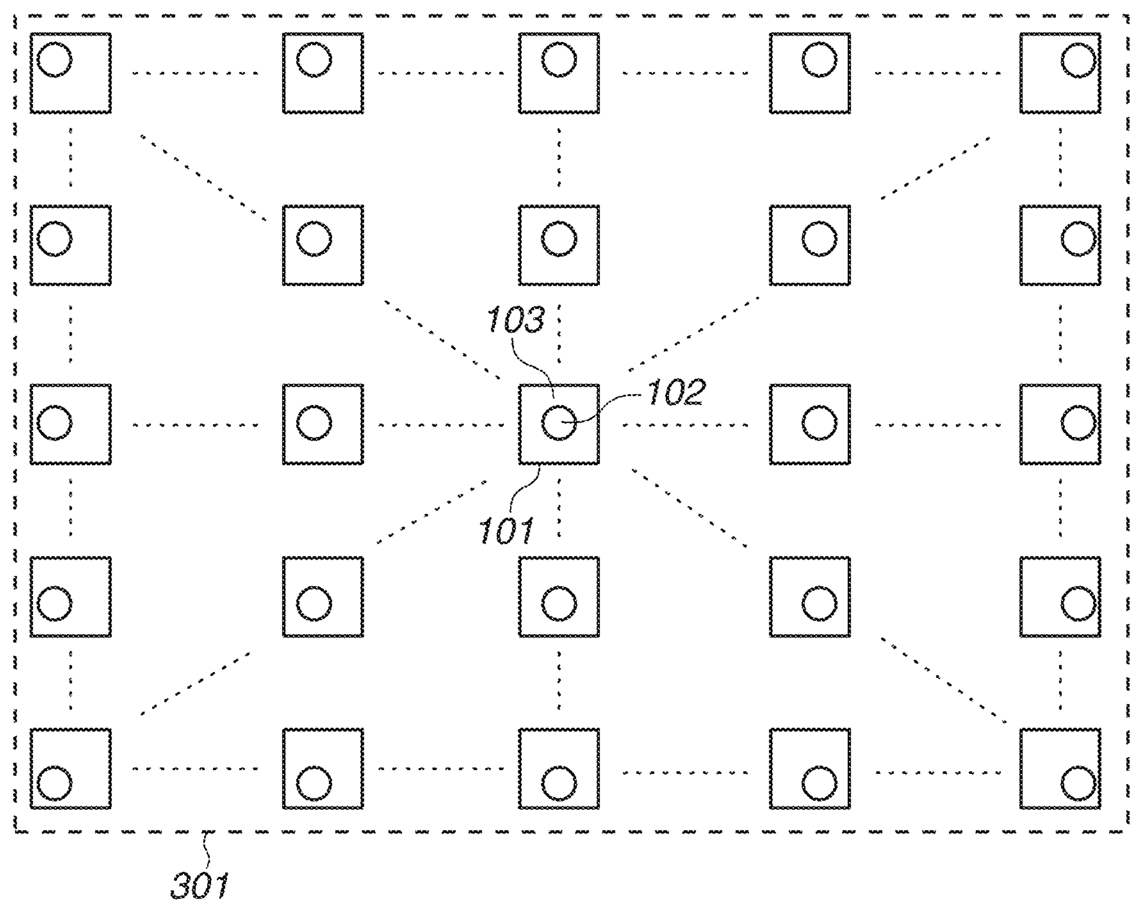
FIG. 5 is a diagram schematically illustrating a planar structure of an entire pixel area of the photoelectric conversion apparatus according to the first exemplary embodiment.
Figure 6:
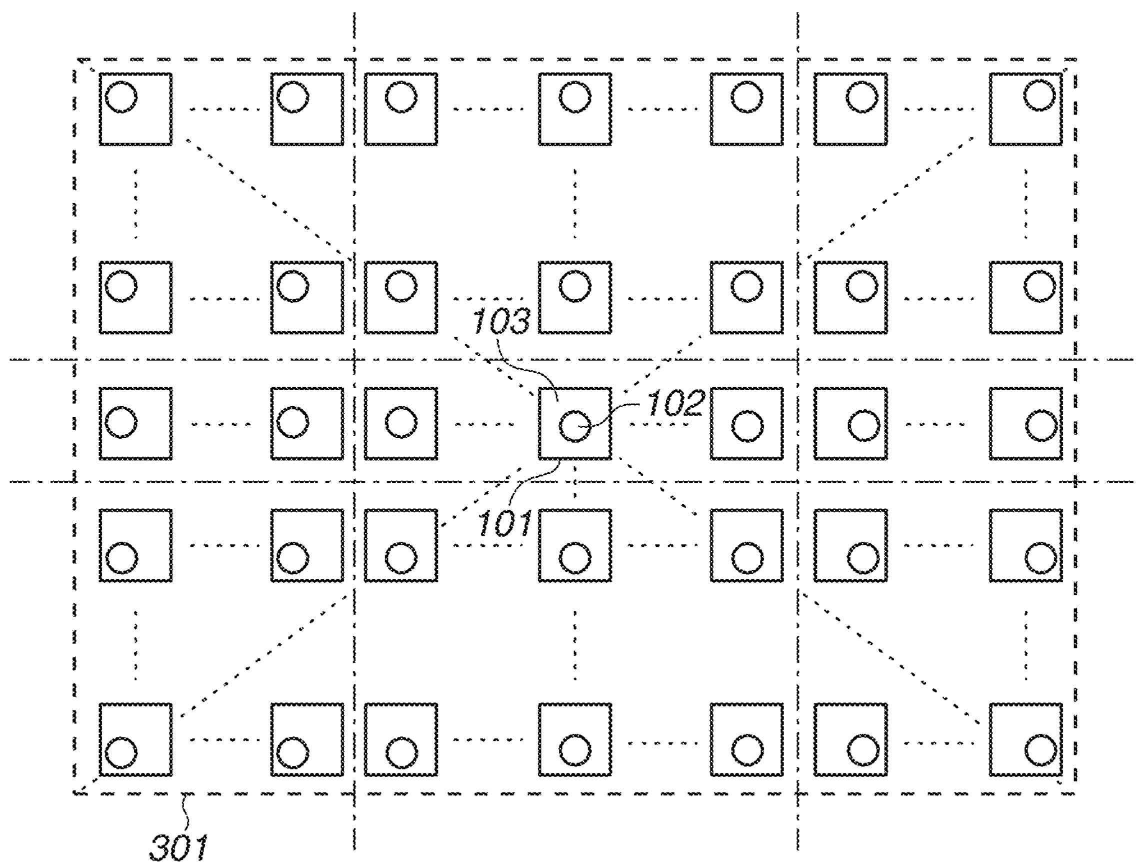
FIG. 6 is a diagram schematically illustrating a planar structure of the entire pixel area of the photoelectric conversion apparatus according to the first exemplary embodiment.
Figure 7:
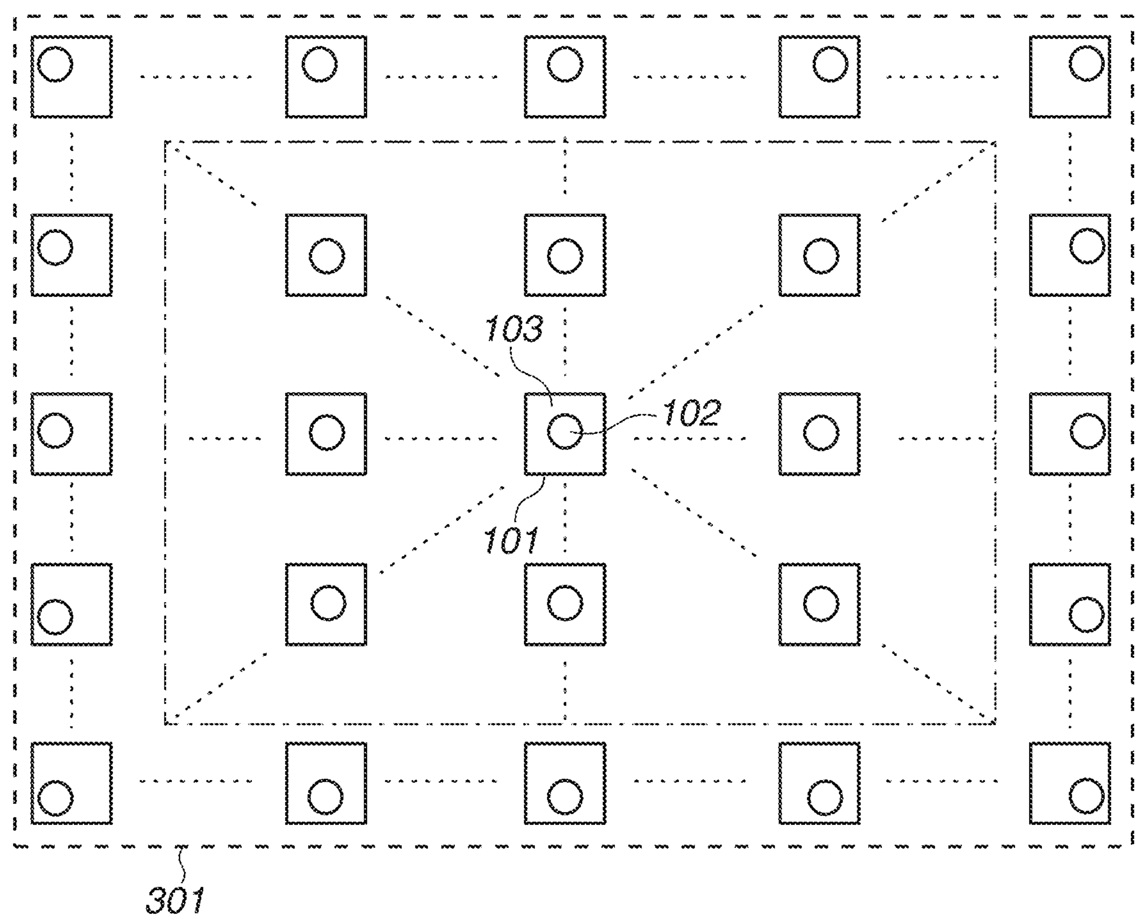
FIG. 7 is a diagram schematically illustrating a planar structure of the entire pixel area of the photoelectric conversion apparatus according to the first exemplary embodiment.
Figure 8:
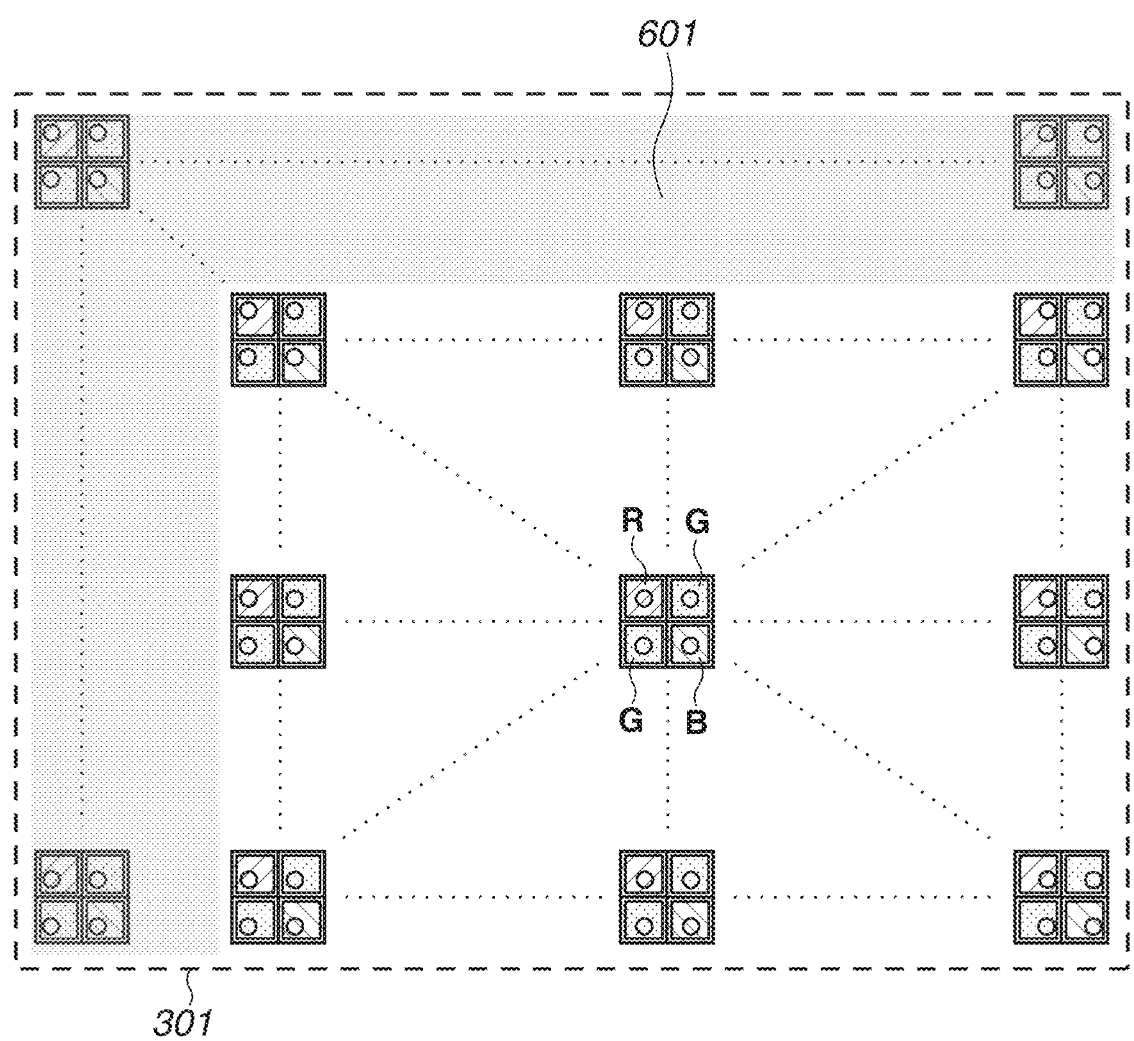
FIG. 8 is a diagram schematically illustrating a planar structure including a color filter of the photoelectric conversion apparatus according to the first exemplary embodiment.
Figure 9:
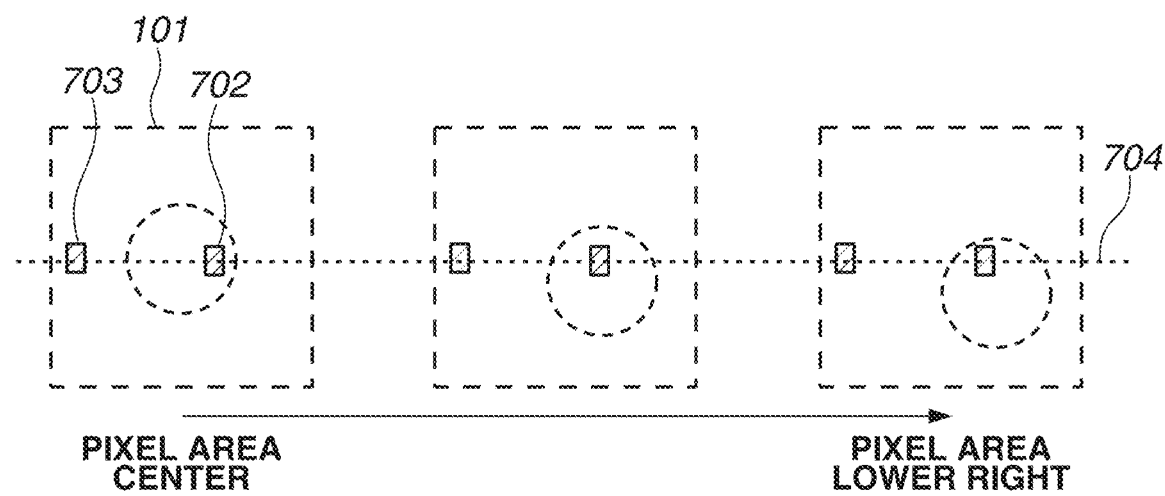
FIG. 9 is a diagram schematically illustrating a planar structure including a transfer gate of the photoelectric conversion apparatus according to the first exemplary embodiment.
Figure 10:
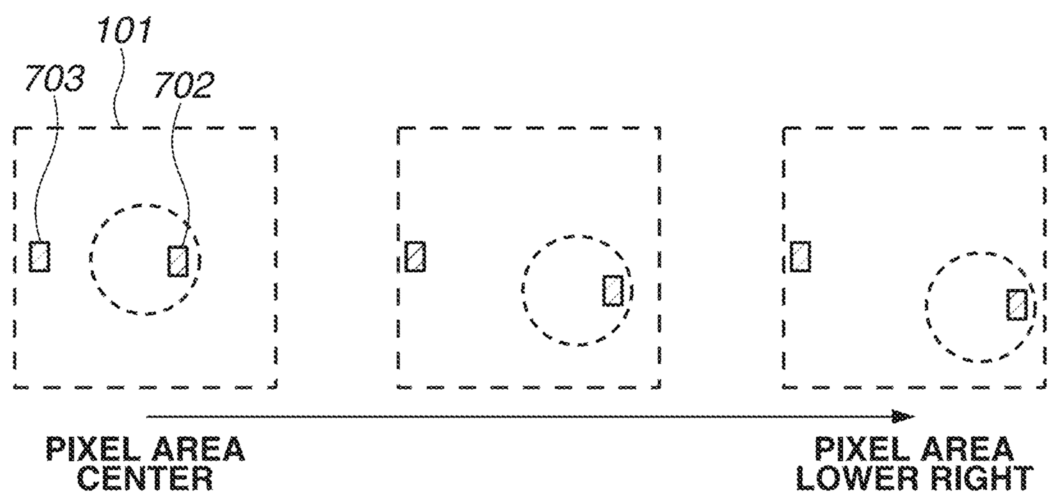
FIG. 10 is a diagram schematically illustrating a planar structure including a transfer gate of the photoelectric conversion apparatus according to the first exemplary embodiment.
Figure 11:
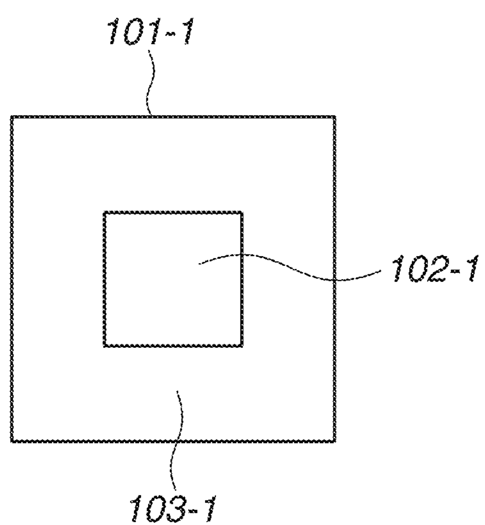
FIG. 11 is a diagram schematically illustrating a planar structure of the photoelectric conversion apparatus according to the first exemplary embodiment.
Figure 12:
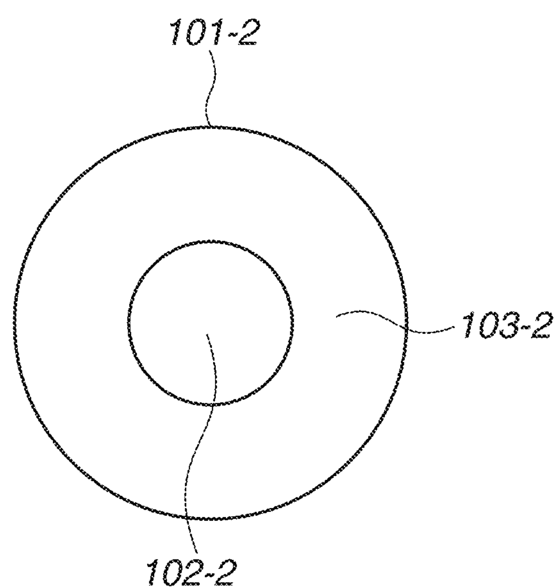
FIG. 12 is a diagram schematically illustrating a planar structure of the photoelectric conversion apparatus according to the first exemplary embodiment.

FIG. 1 is a schematic diagram illustrating the photoelectric conversion apparatus according to the first exemplary embodiment. FIG. 2 is a diagram illustrating an example of a configuration of a pixel circuit of the photoelectric conversion apparatus according to the first exemplary embodiment. FIG. 3 is a diagram schematically illustrating a planar structure of the photoelectric conversion apparatus according to the first exemplary embodiment. FIG. 4 is a diagram schematically illustrating light concentration of a microlens in a pixel area according to the first exemplary embodiment. FIG. 5 is a diagram schematically illustrating a planar structure of the entire pixel area of the photoelectric conversion apparatus according to the first exemplary embodiment. FIGS. 6 and 7 are diagrams each schematically illustrating a planar structure of the entire pixel area of the photoelectric conversion apparatus according to the first exemplary embodiment. FIG. 8 is a diagram schematically illustrating a planar structure including a color filter of the photoelectric conversion apparatus according to the first exemplary embodiment. FIGS. 9 and 10 are diagrams each schematically illustrating a planar structure including a transfer transistor of the photoelectric conversion apparatus according to the first exemplary embodiment. FIGS. 11 and 12 are diagrams each schematically illustrating a planar structure of the photoelectric conversion apparatus according to the first exemplary embodiment.

Overall Configuration of Photoelectric Conversion Apparatus

As illustrated in FIG. 1, the photoelectric conversion apparatus according to the first exemplary embodiment includes a pixel area 301, a timing generator 302, a column signal processing circuit 303, and a signal processing circuit 304.

In the pixel area 301, a pixel matrix in which a plurality of pixels 100 is arranged in a plurality of rows and a plurality of columns is formed.

A control signal line 305 extending in a row direction (horizontal direction in FIG. 1) is provided to each row of the pixel matrix in the pixel area 301. The control signal line 305 is connected to each of the pixels 100 arranged in the row direction and forms a signal line common to these pixels 100. To each column of the pixel matrix in the pixel area 301, a vertical output line 209 extending in a column direction (vertical direction in FIG. 1) is provided. The vertical output line 209 is connected to each of the pixels 100 arranged in the column direction and forms a signal line common to these pixels 100. While one vertical output line is drawn in FIG. 1, a plurality of vertical output lines may be connected to each of the pixels 100 depending on an output signal.

The number of pixels 100 included in the pixel area 301 is not particularly limited. For example, as in a general digital camera, the pixel area 301 may include the pixels 100 arranged in thousands of rows and thousands of columns, or the pixel area 301 may include a plurality of the pixels 100 arranged in one row or in one column.

The control signal line 305 of each row is connected to the timing generator 302. Pixel signals read from the pixels 100 are input to the column signal processing circuit 303 via the vertical output line 209. The column signal processing circuit 303 may include a memory or the like configured to hold the pixel signals read from the pixels 100. A pixel signal output from the column signal processing circuit 303 is sequentially output for each column via the signal processing circuit 304.

Configuration of Pixel

A configuration and a connection relationship of each pixel 100 according to the present exemplary embodiment will be described. FIG. 2 is an equivalent circuit diagram of the pixel circuit according to the first exemplary embodiment. As illustrated in FIG. 3, the pixel 100 includes a photoelectric conversion unit 101 and a transistor area (not illustrated), and the photoelectric conversion unit 101 includes a photodiode (hereinafter, referred to as PD) 102 and a PD 103.

The pixel circuit includes the PD 102 and the PD 103. The pixel circuit 10 further includes transfer transistors 201-1 and 201-2. The pixel circuit further includes an overflow transistor 205, a floating diffusion (FD) capacitor 202, a gain control transistor 204, a capacitor element 203, a reset transistor 206, a source follower transistor 207, and a select transistor 208. Some of these transistors are arranged in a transistor area.

A function and a connection of each element will be described.

The PD 102 and the PD 103 are each an example of the photoelectric conversion unit. When light is incident on each of the PD 102 and the PD 103, an electric charge is generated by photoelectric conversion, and each of the PD 102 and the PD 103 accumulates the generated electric charge as a signal charge. Anodes of the PD 102 and the PD 103 are each connected to a ground potential. The PD 102 is connected to the transfer transistor 201-1, and the PD 103 is connected to the transfer transistor 201-2 and the overflow transistor 205.

The transfer transistor 201-1 and an input node (gate) of the source follower transistor 207 are electrically connected, and the transfer transistor 201-2 and the input node of the source follower transistor 207 are electrically connected.

Control signals TX1 and TX2 are input to the gates of the transfer transistors 201-1 and 201-2, respectively. When each of the control signals TX1 and TX2 is at High level, the signal charge is transferred from each of the photodiodes to the input node of the source follower transistor 207.

The overflow transistor 205 is connected to a power supply VDD and the PD 103. To the gate of the overflow transistor 205, a control signal OF is input. In the overflow transistor 205, a potential barrier corresponding to a gate potential is formed. When the control signal OF is at High level, the signal charge is transferred from the PD 103 to the power supply VDD. If the control signal OF is an intermediate electric potential LM1 or more (Low<LM1<High), the potential barrier between the power supply VDD and the PD 103 is at a lower level than that of a barrier in another area, and thus, it is possible to discharge an excess electric charge to the power supply VDD. The potential barrier between the power supply VDD and the PD 103 is typically lower than the potential barrier of the transfer transistor 201-2.

Gates of the transfer transistors 201-1 and 201-2, the gain control transistor 204, and the source follower transistor 207 are connected to each other to form one node. Such one node may be called a FD node or an FD unit.

In FIG. 2, a capacitor of the FD unit is represented as the FD capacitor 202. The FD capacitor 202 may include a parasitic capacitor component of wiring included in the FD unit and a parasitic capacitor component of a gate of a transistor connected to the FD unit. The FD capacitor 202 may also include a PN junction capacitor component of a semiconductor region included in the FD unit and a PN junction capacitor component of a source or a drain of the transistor connected to the FD unit. In addition to these capacitor components, the FD capacitor 202 may include a capacitor element such as a polysilicon-insulator-polysilicon (PIP) capacitor, a metal-insulator-metal (MIM) capacitor, or a metal oxide semiconductor (MOS) capacitor. When such a capacitor element is arranged, one end of the capacitor element is connected to the gates of the transfer transistors 201-1 and 201-2, the gain control transistor 204, and the source follower transistor 207.

The gain control transistor 204 is connected to one of terminals of the capacitor element 203 and the reset transistor 206. A control signal GC is input to the gate of the gain control transistor 204. When the control signal GC is at Low level and the gain control transistor 204 is turned off in a state where an electric charge is accumulated in the capacitor element 203, the capacitor element 203 is separated from the FD capacitor 202. When the control signal GC is switched between High level and Low level and the gain control transistor 204 is switched between on and off, whether the capacitor element 203 is considered as part of the FD capacitor 202 is switched so that a gain of electric charge-voltage conversion can be made different. When the control signal GC is the intermediate electric potential LM1 or more (Low<LM1<High), the potential barrier between the capacitor element 203 and the PD 103 is at a lower level than that of a barrier in another area, and thus, it is possible to discharge an excess electric charge to the capacitor element 203. Typically, the potential barrier is lower than that of the FD capacitor 202.

The reset transistor 206 and the source follower transistor 207 is each connected to the power supply VDD. A control signal RES is input to the gate of the reset transistor 206. When the control signal RES is at High level, the reset transistor 206 is turned on. When the reset transistor 206 is turned on, it is possible to reset some or all of the PD 102, the PD 103, the FD unit, and the capacitor element 203.

The source follower transistor 207 is connected to the vertical output line 209 via the select transistor 208. A control signal SEL is input to the gate of the select transistor 208. When the control signal SEL is at High level, the select transistor 208 is turned on, and the source follower transistor 207 and the power supply VDD form a source follower circuit.

The anode of the PD 102 and the anode of the PD 103 are each connected to the ground potential. Further, the FD capacitor 202 and the other terminal of the capacitor element 203 are each described as being connected to the ground potential.

The PD 103 includes an area having a low potential for an electron as a signal charge, and a potential barrier against the signal charge is formed around the area. More specifically, a cathode of the PD 103 has an area with a locally high potential. Thus, the generated signal charge is accumulated in the cathode of the PD 103. As the electron being the signal charge is accumulated, a cathode potential of the PD 103 decreases. As a result, a height of the potential barrier formed around the PD 103 becomes low.

Of the electric charges generated by photoelectric conversion, excess electric charges may be generated in excess of an amount that can be accumulated in the photodiode. If a large amount of light is incident on the PD 103 and the excess electric charges are generated, the excess electric charges overflow from a lowest part of the potential barrier.

The transfer transistor 201-2 exists between the PD 103 and the FD unit, and the gain control transistor 204 exists between the FD unit and the capacitor element 203. With the electric potential of the gate of the transfer transistor 201-2, it is possible to control a height of the potential barrier in an area immediately below the gate of the transfer transistor 201-2, i.e., the height of the potential barrier in a channel area of the transfer transistor 201-2. Similarly, with a gate electric potential of the gain control transistor 204, it is possible to control a height of the potential barrier in an area immediately below the gate of the gain control transistor 204, i.e., the height of the potential barrier in a channel area of the gain control transistor 204.

The control signal TX2 of the transfer transistor 201-2 is controlled so that the potential barrier between the photodiode PD 103 and the FD unit is the lowest among potential barriers surrounding the photodiode PD 103. At this time, excess electric charges generated in the PD 103 are discharged via the transfer transistor 201-2. If the gain control transistor 204 is off, the discharged excess electric charges are retained in the FD unit. With the control signal GC input to the gain control transistor 204, turning on and off of the gain control transistor 204 is controlled. If the gain control transistor 204 is on, the discharged excess electric charges are retained in the FD unit and the capacitor element 203.

With reference to FIGS. 3 to 5, a structure of the pixel and light incident on the pixel according to the present exemplary embodiment will be described.

FIG. 3 is a schematic diagram schematically illustrating a configuration of the photoelectric conversion unit 101 constituting the pixel. The area of a light receiving portion of the PD 102 is smaller than the area of a light receiving portion of the PD 103, and the PD 102 is surrounded by the PD 103. A microlens (see FIG. 4) having a light concentration function is provided to each pixel on a light incident side of the photoelectric conversion unit 101.

In the drawings of the present exemplary embodiment, a total of the area of the light receiving portion of the PD 102 and the area of the light receiving portion of the PD 103 is the same for all the pixels, but a photoelectric conversion apparatus including a pixel having a total of the areas different from those of other pixels may also be employed.

FIG. 4 is a diagram schematically illustrating a light concentration state of the microlens at a center of the pixel area 301 and at an outer edge of the pixel area 301 of each of the pixels having the photoelectric conversion unit 101 illustrated in FIG. 3.

At the center of the pixel area 301, a bundle of light beams passing through the microlens is concentrated on the center of the photoelectric conversion unit 101. A ratio of an amount of light incident on the PD 102 to an amount of light incident on the PD 103 corresponds to an area ratio of the PD 102 to the PD 103. In other words, the area ratio of the PD 102 to the PD 103 is a sensitivity ratio for the incident light of the PD 102 to the PD 103. When the area ratio of the PD 102 to the PD 103 is 1:n, an image signal having an expanded dynamic range can be obtained by multiplying a signal based on an electric charge generated in the PD 102 by the sensitivity ratio n, and then adding thereto a signal based on an electric charge generated in the PD 103.

However, at the outer edge of the pixel area 301, the bundle of light beams passing through the microlens is concentrated on a position shifted outward (position in a centrifugal direction) when viewed from the center of the pixel area 301. Thus, the ratio of the amount of light incident on the PD 102 to the amount of light incident on the PD 103 is not 1:n, which is the area ratio of the PD 102 to the PD 103.

In this case, to obtain the image signal having an expanded dynamic range, a correction using a "shading correction coefficient" is applied in consideration of the above-mentioned shift of the position on which the bundle of light beams is concentrated. Specifically, the signal based on the electric charge generated in the PD 102 is multiplied by the sensitivity ratio n and is further multiplied by the shading correction coefficient, and then the signal based on the electric charge generated in the PD 103 is added thereto. The shading correction coefficient takes a value different depending on an inclination state of the bundle of light beams from a lens (optical system) forming a subject image. Thus, the value of the shading correction coefficient (or a shading correction coefficient group) may vary for each of a plurality of types of lenses.

FIG. 5 is an explanatory diagram illustrating a configuration in the pixel area 301 according to the first exemplary embodiment. In consideration of the shift of the light concentration position of the bundle of light beams passing through the microlens at the outer edge of the pixel area 301, in each of the pixels, an in-plane position of the PD 102 in the photoelectric conversion unit 101 is arranged to be shifted toward the centrifugal direction of the pixel area 301 so that the position of the PD 102 and the light concentration position are brought close to each other or coincided with each other. Thus, the light beams passing through the microlens are incident on both the PD 102 and the PD 103, and thus, the signal having an expanded dynamic range can be calculated without the correction using the shading correction coefficient.

As described above, to obtain a larger amount of received light than an amount of received light obtained in a state where the PD 102 is not eccentric to the pixel, the PD 102 according to the present exemplary embodiment is arranged to be eccentric to the pixel in the centrifugal direction of the pixel area 301 so that the PD 102 is positioned to be closer to the light concentration position of the bundle of light beams or at the light concentration position of the bundle of light beams. An eccentricity ratio of the PD 102 increases as the position at which the pixel is arranged is closer to the edge of the pixel area 301. Here, in other words, the amount of received light is the sensitivity to light, and higher sensitivity can be achieved as a larger amount of received light is obtained.

In FIG. 5, a relative position of the PD 102 is different for each of the pixels depending on the position of the pixel in the pixel area 301. In such an arrangement, a difference in the planar distance between the center of the PD 102 of each of two pixels arranged in a certain direction and the center of the pixel area 301 is larger than a difference in the planar distance between the center of the PD 103 of each of the two pixels and the center of the pixel area 301. Here, the center of the PD 102, the PD 103, or the pixel area 301 refers to the center of gravity, for example.

The arrangement of the PD 102 is not limited to the above arrangement, and for example, as illustrated in FIG. 6, the pixel area 301 may be divided into a plurality of sub-areas, and the relative position of the PD 102 in each of the pixels may be different for each of the sub-areas. Simplifying a structure of a pixel matrix in this way makes it possible to simplify a manufacturing process thereof.

When the structure illustrated in FIG. 6 is employed, the relative positions of PDs 102 of a plurality of pixels in one sub-area are the same, and a pixel having the PD 102 shifted in position from the light concentration position is included in each of the sub-areas. However, in comparison with a case where the relative positions of the PDs 102 of all the pixels in the pixel area 301 are the same, such an arrangement reduces the shift in position of each of the PDs 102 from the light concentration position. In FIG. 6, the pixel area 301 is divided into nine sub-areas, but the number of sub-areas may be freely set based on a required image quality and process.

In another example of the arrangement of the PD 102, as illustrated in FIG. 7, in a pixel area central portion, the center of the PD 103 and the center of the PD 102 may be coincided. In this example, only in a pixel arranged in a pixel area outer edge portion where the shift in light concentration position of the bundle of light beams concentrated by the microlens is large, the center of the PD 102 may be shifted from the center of the PD 103 so that the position of the PD 102 and the light concentration position are brought closer to each other or coincided with each other.

In this example, among a plurality of pixels located in the pixel area central portion, the position of the PD 102 is shifted from the light concentration position of the bundle of light beams in some of the pixels, so that shading occurs.

However, the shading occurring in the pixels in the pixel area central portion is very weak compared to shading occurring in the pixel area outer edge portion. Thus, as described above, a signal obtained from the pixels in the pixel area central portion does not cause a serious issue in image quality even without the correction using the shading correction coefficient.

With such a configuration, it is possible to obtain an image with sufficient image quality by a simple operation. The correction is not required, and thus, it is possible to reduce power consumption. In addition, a circuit used for the correction is not required, and thus, a degree of flexibility in the pixel arrangement is improved.

The signal obtained from the pixels located in the pixel area central portion may be corrected using an existing shading correction coefficient.

For example, in the pixel area central portion where the shading is very weak, the shading is corrected using a correction coefficient. On the other hand, in the pixel area outer edge portion where the shading is not sufficiently corrected by correction using the correction coefficient for the very weak shading, the position of the PD 102 is shifted to coincide the light concentration position so that the shading does not occur. With such a configuration, it is possible to obtain an image having higher quality.

Here, the pixel area outer edge portion refers to, for example, an edge portion corresponding to 10% of the pixel area 301 and surrounded by a dash-dot-dash line and a broken line, as illustrated in FIG. 7. The pixel area central portion refers to, for example, a portion other than the pixel area outer edge portion of the pixel area 301 (an area inside the dash-dot-dash line in FIG. 7).

In the example of FIG. 7, the pixel area central portion is considered an area similar in shape to the entire pixel area 301, and is defined as a portion having the area corresponding to 90% of the area of the pixel area 301 and having the same center as the pixel area 301. If the pixel area 301 is rectangular as illustrated in FIG. 7, the pixel area central portion may be defined as a rectangular area having a side that is 90% of the length in a longer direction of the pixel area 301 and a side that is 90% of the length in a shorter direction of the pixel area 301 and having the same center as the pixel area 301.

In the present exemplary embodiment, a range of the pixel area outer edge portion is the edge portion corresponding to 10% of the pixel area 301, but the pixel area central portion and the pixel area outer edge portion may be freely set based on the required image quality. The pixel area outer edge portion may be further divided into a plurality of areas, so that an area applied with the shading correction and an area not applied with the shading correction may be set in a nested manner.

Further, in the present exemplary embodiment, configuration may be employed in which the center of the PD 102 of each pixel is arranged to be shifted in a certain direction such as in a vertical direction or in a lateral direction relative to the center of the PD 103, and not to be shifted in a diagonal direction which is a combination of the vertical and lateral directions.

In any case, the center of the PD 102, which is eccentric with respect to the pixel, is arranged to be shifted from the center of the PD 103 in the centrifugal direction of the pixel area 301.

A case is considered where three pixels which are not on a straight line are selected as a pixel group from among the pixels in the pixel area 301. Due to the above arrangement where the center of the PD 102 is shifted in the centrifugal direction, there is a plurality of pixel groups in such a manner that the area of a triangle formed by connecting the centers of PDs 103 of pixels of each of the plurality of pixel groups is smaller than the area of a triangle formed by connecting the centers of PDs 102 of the pixels of the pixel group.

FIG. 8 illustrates an arrangement of a color filter and an arrangement of a light shielding portion in the pixel according to the first exemplary embodiment.

In the present exemplary embodiment, each pixel includes a color filter of one color on the light incident side of the photoelectric conversion unit. Color filters are arrayed in the pixel area 301 in such a manner that the color filters arranged in the Bayer array in two rows and two columns and the corresponding pixels are set as a repeating unit, and a plurality of repeating units is arranged.

In the present exemplary embodiment, the pixel area 301 is divided into a pixel on which light is incident and a light shielded pixel on which no light is incident by using a light shielding portion 601. At this time, a configuration is employed in which the color filter is also arranged on the light shielded pixel covered with the light shielding portion 601 to have continuity with the pixel on which light is incident. With such a configuration, it is possible to correct dark shading occurring in the pixel area 301 in which the center of the PD 102 is shifted from the center of the PD 103 of each of the pixels 100, with information obtained from the light shielded pixel covered with the light shielding portion 601. Here, the dark shading refers to a dark current generated in the light shielded pixel. More specifically, a signal obtained in the light shielded pixel is subtracted from a photoelectric conversion signal obtained from a pixel other than the light shielded pixel. As a result, it is possible to remove or reduce noise resulting from the dark current.

In the present exemplary embodiment, the case is described where the adjacent pixels have color filters corresponding to colors different from each other. However, a color filter of one color may be arranged for each of a plurality of pixels as in what is called a Quad Bayer array where color filters of the same color are arranged on every four pixels in two rows and two columns adjacent to one another.

FIG. 9 schematically illustrates a planar structure including a transistor of the photoelectric conversion apparatus according to the first exemplary embodiment. FIG. 9 illustrates plan views of photoelectric conversion units 101 of pixels in a pixel area center portion, in a pixel area lower right side portion, and at an intermediate point between these portions. FIG. 9 illustrates transfer gates 702 and 703 provided in the transfer transistor that is a typical example of a transistor provided in the pixel. The transistor included in the transistor area may be a transistor different from the transfer transistor. The transistor area may be an area including, for example, any of the transistors 204 to 208 illustrated in FIG. 2 or a combination of a plurality of transistors.

Each pixel is formed on a semiconductor substrate, and the semiconductor substrate includes a semiconductor layer including the photoelectric conversion unit 101 and a wiring layer including wiring. In the example of FIG. 9, the relative position in each pixel of the transfer gate 702, provided in the transfer transistor configured to transfer the electric charge of the PD 102, and the transfer gate 703, provided in the transfer transistor configured to transfer the electric charge of the PD 103, is not changed across the pixel area 301. In other words, the relative position of the transfer gate 703 with respect to the PD 103 is the same among the pixels in a cross section taken along a line 704 dividing the pixels into two. More specifically, a distance from an edge of the pixel defined by a pixel separation portion (not illustrated) to the transfer gate is the same among the pixels. The pixel separation portion may be formed by insulation separation. The insulation separation is formed by local oxidation of silicon (LOCOS), shallow trench isolation (STI), deep trench isolation (DTI), or the like. The pixel separation portion may be formed as a semiconductor region of an opposite conductivity type in which a main carrier is an electric charge having a polarity opposite to the electric charge accumulated as a signal charge by the photoelectric conversion unit 101. Further, the pixel separation portion may be formed by combining the insulation separation and separation by the semiconductor region of the opposite conductivity type.

A distance between transfer gates 703 of the adjacent pixels is constant among a plurality of pixels arranged in the same row. Similarly, a distance between transfer gates 702 of the adjacent pixels is constant among the plurality of pixels arranged in the same row. A distance between the transfer gate 703 and the transfer gate 702 in one pixel is also constant among the plurality of pixels arranged in the same row. While the configuration of the pixels in the same row is described in FIG. 9, the configuration of pixels illustrated in FIG. 9 may also be applied to pixels in a plurality of rows. The configuration of pixels illustrated in FIG. 9 may also be applied to the entire pixel area 301. In FIG. 9, the edge of the photoelectric conversion unit 101 is an outer periphery of the photoelectric conversion unit 101, and a distance along the line 704 from an intersection of the outer periphery of the photoelectric conversion unit 101 and the line 704 to the transfer gate is compared. In this case, it is possible to create at least portions of MOS and wiring that are included in the pixel circuit of FIG. 2 and to be connected to the transfer gate, uniformly in all the pixels, and thus, it is easy to design the MOS and the wiring of the pixel circuit.

FIG. 10 schematically illustrates a planar structure including a transistor of the photoelectric conversion apparatus according to the first exemplary embodiment. FIG. 10 illustrates plan views of the photoelectric conversion units 101 of pixels in the pixel area center portion, in the pixel area lower right side portion, and at an intermediate point between these portions. In an example of FIG. 10, the position of the transfer gate 702 changes based on the position where the PD 102 is arranged. Thus, the position of the transfer gate 702 differs depending on the position of the pixel in the pixel area 301.

For example, the pixel area 301 may be divided into a plurality of sub-areas, and the relative position of the transfer gate 702 with respect to the PD 102 may be differed for each sub-area.

In the case of the planar structure illustrated in FIG. 10, the MOS and the wiring included in the pixel circuit of FIG. 2 are changed based on the position of the transfer gate 702. However, this eliminates limitation on the relative position of the PD 102 in the pixel, and thus, it is possible to arrange the PD 102 at a desired position such as the same position as the light concentration position of the bundle of light beams from the microlens or a position close to the light concentration position.

Both FIG. 11 and FIG. 12 are schematic diagrams each illustrating a modification of the pixel configuration of the first exemplary embodiment.

In FIG. 11, the configuration where the photoelectric conversion unit 101 of the pixel 100 includes the PD 102 and the PD 103 is in much the same way as in FIG. 3, but the shape of the PD 102 is a quadrangle. The outer periphery of the PD 102 has a similar shape to the outer periphery of the PD 103, and thus, calculation of the area ratio and signal processing based on the area ratio are easy.

In the modification illustrated in FIG. 12, the PD 102 is circular and the PD 103 is annular. Thus, as in the example of FIG. 11, the signal processing is easy.

As illustrated in FIGS. 11 and 12, the planar structure of the pixel according to the present exemplary embodiment is not limited to the shape illustrated in FIG. 3.

The PD 102 (first photoelectric conversion unit) and the PD 103 (second photoelectric conversion unit) surrounding the PD 102, illustrated in FIGS. 3, 11, and 12, are each constituted of one photoelectric conversion unit. However, the PD 102 and PD 103 may each be constituted of two or more photoelectric conversion units independent from each other.

For example, the PD 103 (second photoelectric conversion unit) surrounding the PD 102 (first photoelectric conversion unit) may be constituted of a third photoelectric conversion unit (PD) surrounding the PD 102 and a fourth photoelectric conversion unit (PD) surrounding the third photoelectric conversion unit.

Further, the photoelectric conversion unit that surrounds the PD 102 is not limited to a form of one photoelectric conversion unit continuous around the circumference and may take a form of a plurality of photoelectric conversion units (for example, arc-shaped photoelectric conversion units) arranged in a circumferential direction to form a substantially annular shape.

The area ratio of the PD 102 to the PD 103 is not limited to being uniform over the entire pixel area. For example, the area of the PD 102 in the pixel area outer edge portion with a reduced amount of light incident on the PD 102 may be increased relative to that in the pixel area central portion, and shading may be reduced by further applying the present exemplary embodiment.

In the photoelectric conversion apparatus, when the configuration of the first exemplary embodiment is applied, it is possible to create a signal with an expanded dynamic range without performing correction using the shading correction coefficient on photoelectric conversion signals from the PDs of some or all of the pixels.

The photoelectric conversion apparatus according to the exemplary embodiment described above may be configured to have a laminated structure in which the PD 102 and the PD 103 are arranged on one common semiconductor substrate, the circuits are arranged on a plurality of semiconductor substrates including the one common semiconductor substrate, and the substrates are laminated.

Figure 13:
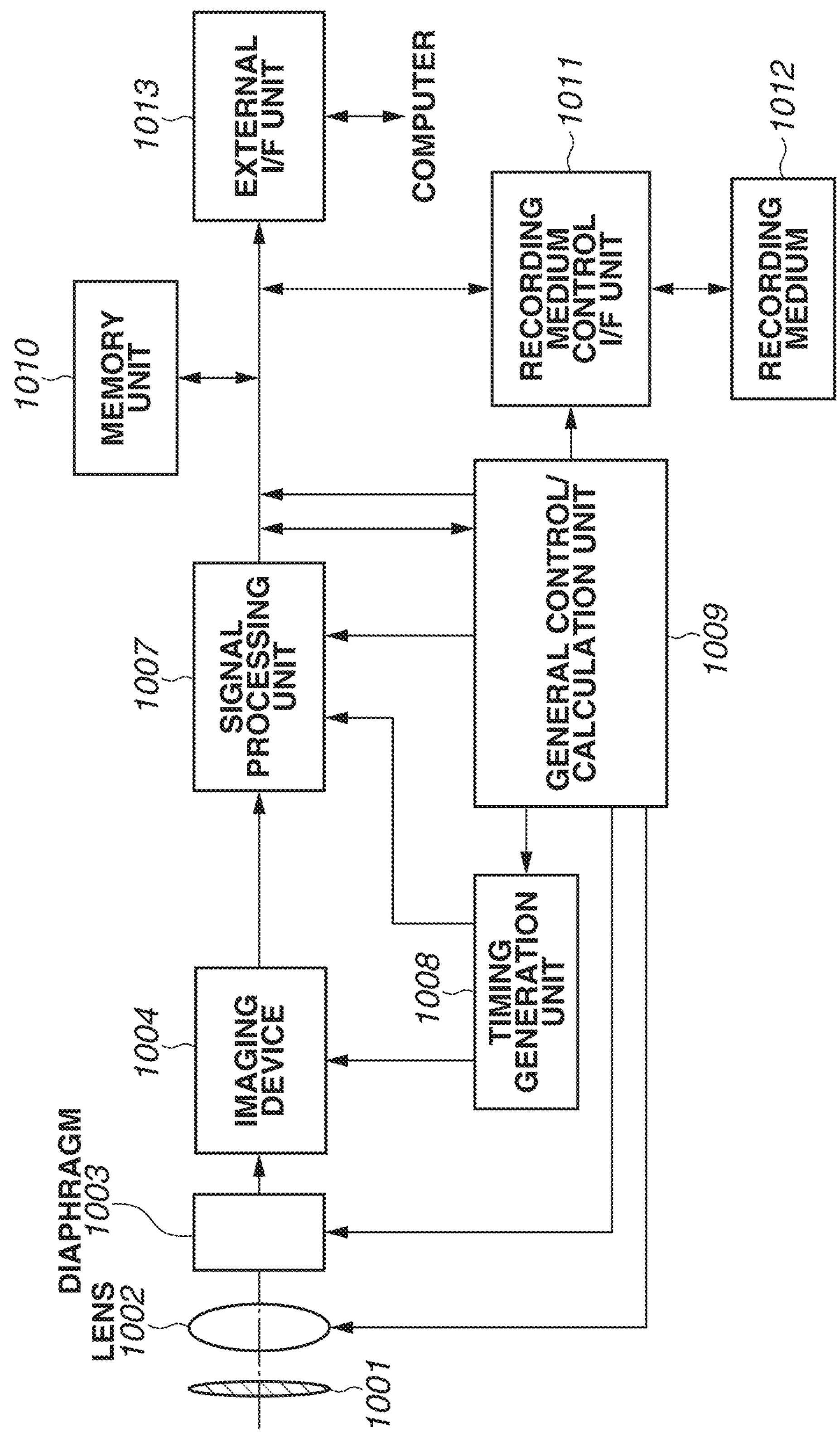
FIG. 13 is a block diagram schematically illustrating a configuration of an imaging system according to a second exemplary embodiment.

A photoelectric conversion system according to a second exemplary embodiment will be described with reference to FIG. 13. FIG. 13 is a block diagram schematically illustrating a configuration of the photoelectric conversion system according to the present exemplary embodiment.

The photoelectric conversion apparatus described in the first exemplary embodiment is applicable to various types of photoelectric conversion system. Examples of the photoelectric conversion system to which the photoelectric conversion apparatus is applicable include a digital still camera, a digital camcorder, a monitoring camera, a copier, a fax machine, a cellular phone, an on-vehicle camera, and an observation satellite. Further, a camera module including an optical system such as a lens and an imaging device is also included in the photoelectric conversion system. FIG. 13 illustrates a block diagram of a digital still camera as an example of such photoelectric conversion system.

A photoelectric conversion system illustrated in FIG. 13 includes an imaging device 1004 being an example of the photoelectric conversion apparatus, and a lens 1002 configured to form an optical image of a subject on the imaging device 1004. The photoelectric conversion system further includes a diaphragm 1003 configured to vary an amount of light having passed through the lens 1002, and a barrier 1001 configured to protect the lens 1002. The lens 1002 and the diaphragm 1003 constitute an optical system configured to concentrate light on the imaging device 1004. The imaging device 1004 is the photoelectric conversion apparatus according to any one of the above-described exemplary embodiments, and converts an optical image formed by the lens 1002 into an electric signal.

The photoelectric conversion system also includes a signal processing unit 1007 being an image generation unit configured to generate an image by processing an output signal output from the imaging device 1004. The signal processing unit 1007 performs various types of correction and compression as necessary to perform an operation of outputting image data. The signal processing unit 1007 may be formed on a semiconductor substrate on which the imaging device 1004 is mounted, or may be formed on a semiconductor substrate separate from that of the imaging device 1004.

The photoelectric conversion system further includes a memory unit 1010 configured to temporarily store the image data, and an external interface unit (external I/F unit) 1013 configured to communicate with an external computer or the like. Further, the photoelectric conversion system includes a recording medium 1012 such as a semiconductor memory into and from which imaging data is recorded and read, and a recording medium control interface unit (recording medium control I/F unit) 1011 configured to record and read imaging data into and from the recording medium 1012. The recording medium 1012 may be built in the photoelectric conversion system or may be removable from the photoelectric conversion system.

Further, the photoelectric conversion system includes a general control/calculation unit 1009 configured to perform various types of calculation and control an entire digital still camera, and a timing generation unit 1008 configured to output various types of timing signal to the imaging device 1004 and the signal processing unit 1007. Here, the timing signal may be input from the outside, and in such a case, the photoelectric conversion system includes at least the imaging device 1004 and the signal processing unit 1007 configured to process an output signal output from the imaging device 1004.

The imaging device 1004 outputs an image pickup signal to the signal processing unit 1007. The signal processing unit 1007 performs predetermined signal processing on the image pickup signal output from the imaging device 1004 and outputs image data. The photoelectric conversion system uses the image data to generate an image.

As described above, according to the present exemplary embodiment, it is possible to implement the photoelectric conversion system to which the photoelectric conversion apparatus (imaging device) according to any of the above exemplary embodiments is applied.

Figure 14A:
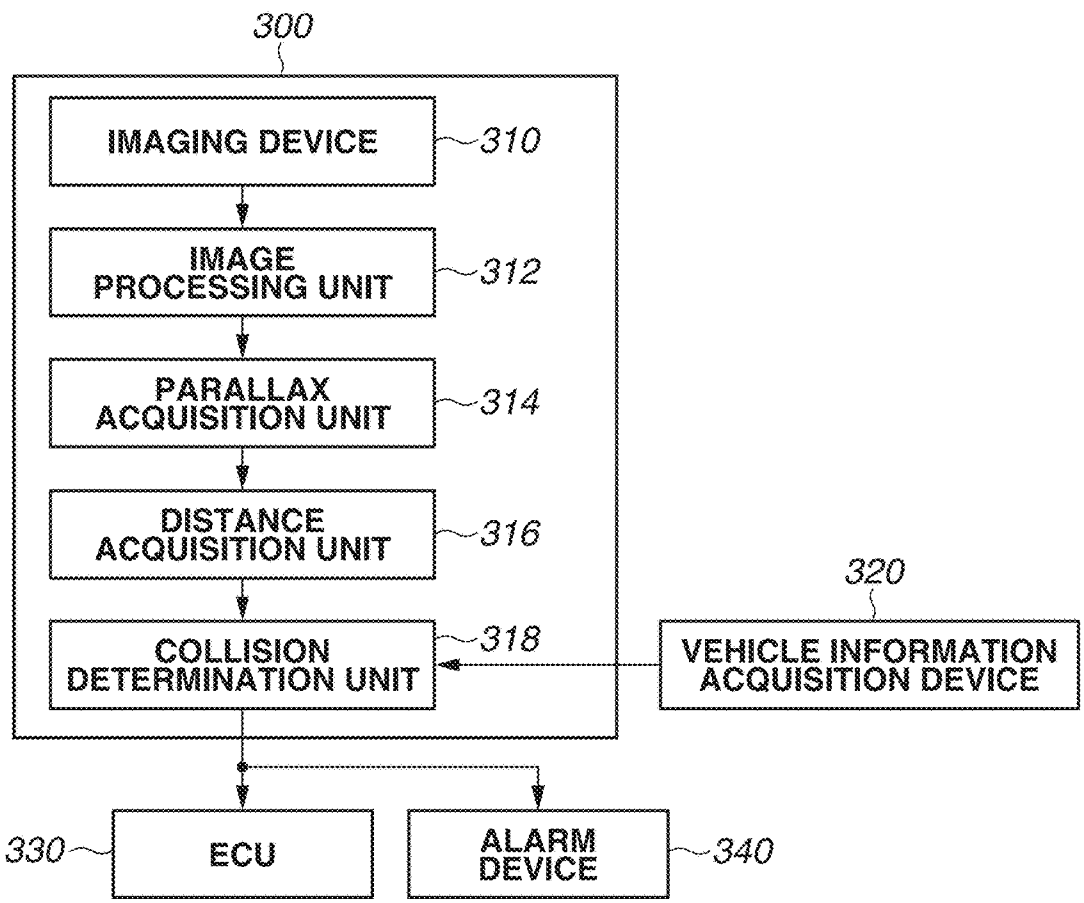
FIGS. 14A and 14B are diagrams illustrating configuration examples of an imaging system and a moving body according to a third exemplary embodiment.
Figure 14B:
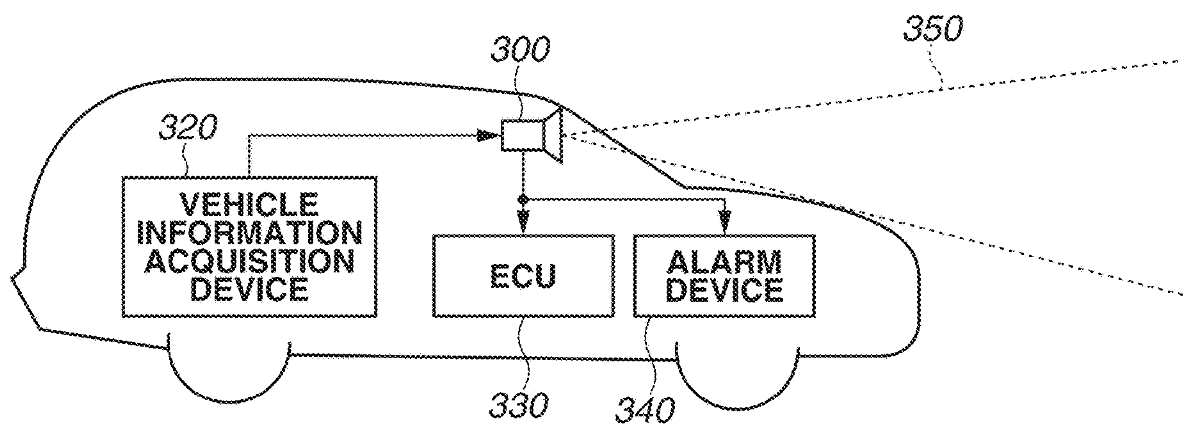

A photoelectric conversion system and a moving body according to a third exemplary embodiment will be described with reference to FIGS. 14A and 14B. FIGS. 14A and 14B are diagrams illustrating configurations of the photoelectric conversion system and the moving body according to the present exemplary embodiment.

FIG. 14A illustrates an example of a photoelectric conversion system for an on-vehicle camera. A photoelectric conversion system 300 includes an imaging device 310. The imaging device 310 is the photoelectric conversion apparatus (imaging device) according to any one of the above exemplary embodiments. The photoelectric conversion system 300 includes an image processing unit 312 configured to perform image processing on a plurality of image data acquired by the imaging device 310, and a parallax acquisition unit 314 configured to calculate parallax (phase difference of a parallax image) from a plurality of image data acquired by the photoelectric conversion system 300. Further, the photoelectric conversion system 300 includes a distance acquisition unit 316 configured to calculate a distance to a target object based on the calculated parallax, and a collision determination unit 318 configured to determine whether there is a possibility of collision based on the calculated distance. Here, the parallax acquisition unit 314 and the distance acquisition unit 316 are examples of a distance information obtaining unit configured to obtain distance information about a distance to the target object. In other words, the distance information includes pieces of information on parallax, a de-focusing amount, a distance to the target object, and the like. The collision determination unit 318 may determine the possibility of collision by using any of these pieces of distance information. The distance information obtaining unit may be implemented by specially designed hardware or may be implemented by a software module. The distance information obtaining unit may be implemented by a field programmable gate array (FPGA), an application specific integrated circuit (ASIC), or the like, or may be implemented by combining these.

The photoelectric conversion system 300 is connected to a vehicle information acquisition device 320, and can acquire vehicle information such as a vehicle speed, a yaw rate, and a steering angle. The photoelectric conversion system 300 is connected with an electric control unit (ECU) 330 being a control device configured to output a control signal for generating a braking force to a vehicle, based on a determination result of the collision determination unit 318. The photoelectric conversion system 300 is also connected to an alarm device 340 configured to issue an alarm to a driver, based on a determination result of the collision determination unit 318. For example, when there is a high possibility of a collision as a result of a determination result of the collision determination unit 318, the ECU 330 controls a vehicle to avoid a collision and alleviate damage by applying a brake, releasing an accelerator, or reducing engine output. The alarm device 340 warns a user by giving an alarm such as a sound, displaying alarm information on a screen of a car navigation system, or vibrating a seat belt or a steering wheel.

In the present exemplary embodiment, the photoelectric conversion system 300 images the periphery of the vehicle, for example, the front or the rear of the vehicle. FIG. 14B illustrates the photoelectric conversion system used when the front of the vehicle (imaging range 350) is imaged. The vehicle information acquisition device 320 transmits an instruction to the photoelectric conversion system 300 or the imaging device 310. With such a configuration, it is possible to further improve the distance measurement accuracy.

In the above description, the example in which controls not to collide with another vehicle are performed is provided, but the photoelectric conversion system can also be applied to control for autonomous driving to follow another vehicle and control for autonomous driving to avoid a lane departure. Further, the photoelectric conversion system may be applied not only to a vehicle such as an automobile but also to a moving body (moving device) such as a ship, an aircraft, or an industrial robot. The photoelectric conversion system may be applied not only to a moving body but also to a device widely using object recognition such as an intelligent transportation system (ITS).

The disclosure is not limited to the above exemplary embodiments, and it is possible to adopt various modified exemplary embodiments being modifications of the above exemplary embodiments.

For example, an example in which part of the configuration of any of the exemplary embodiments is added to another exemplary embodiment and an example in which part of the configuration of another exemplary embodiment is replaced with another exemplary embodiment are included in the exemplary embodiments of the disclosure.

Further, the photoelectric conversion systems according to the second exemplary embodiment and the third exemplary embodiment are examples of the photoelectric conversion system applicable with the photoelectric conversion apparatus. The photoelectric conversion system applicable with the photoelectric conversion apparatus according to an aspect of the embodiments is not limited to the configurations illustrated in FIGS. 13, 14A, and 14B.

The above-described exemplary embodiments are merely examples of an embodiment for carrying out the disclosure, and the technical scope of the disclosure should not be interpreted in a limited manner based on the exemplary embodiments. Thus, the disclosure can be implemented in various forms without departing from the technical concept or main features of the disclosure.

According to the disclosure, it is possible to reduce shading.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2020-191392, filed Nov. 18, 2020, which is hereby incorporated by reference herein in its entirety.

What is claimed is:

1. An apparatus including a pixel area including a plurality of pixels arranged in the pixel area, the apparatus comprising:

a first pixel of the plurality of pixels; and a second pixel arranged at a position closer to an edge of the pixel area than the first pixel, wherein each of the first pixel and the second pixel includes a first conversion unit, a second conversion unit surrounding the first conversion unit, and a transistor area provided with a circuit configured to process a signal based on a charge generated in the first conversion unit and the second conversion unit, and wherein a planar distance between the first conversion unit and the transistor area in the second pixel is longer than a planar distance between the first conversion unit and the transistor area in the first pixel, and wherein a sum of a signal obtained by multiplying a signal generated by the first conversion unit by a value corresponding to a sensitivity ratio between the first conversion unit and the second conversion unit, and a signal generated by the second conversion unit is an image signal.

2. The apparatus according to claim 1,
wherein the first pixel includes a first transfer gate configured to transfer a charge from the first conversion unit,
wherein the second pixel includes a second transfer gate configured to transfer a charge from the first conversion unit, and
wherein the planar distance between the first conversion unit and the transistor area in the first pixel is a planar distance between the first conversion unit and the first transfer gate.

3. The apparatus according to claim 1, wherein a sensitivity of the second conversion unit to incident light is higher than a sensitivity of the first conversion unit to incident light.

4. The apparatus according to claim 1, wherein an area of a light receiving surface of the second conversion unit is larger than an area of a light receiving surface of the first conversion unit.

5. The apparatus according to claim 1,
wherein each of the plurality of pixels includes a microlens having a light concentration function, and
wherein the first conversion unit and the second conversion unit are arranged so that light concentrated on a same microlens is incident.

6. The apparatus according to claim 1,
wherein each of the plurality of pixels includes a transfer gate configured to transfer a charge of the first conversion unit, and
wherein the plurality of pixels includes pixels having a same distance from an edge of each of the pixels to the transfer gate in a cross section dividing each of the pixels into two.

7. The apparatus according to claim 6,
wherein each of the plurality of pixels includes a semiconductor layer and a wiring layer, and
wherein a portion of the wiring layer of each of the plurality of pixels to be connected to the transfer gate has a same structure as a portion of the wiring layer of another pixel.

8. The apparatus according to claim 1,
wherein each of the plurality of pixels has a color filter, and
wherein an array including four pixels arranged in two rows and two columns is repeatedly arranged.

9. The apparatus according to claim 1, comprising a light shielding portion and a light shielded pixel shielded from light by the light shielding portion,
wherein the light shielded pixel corresponds to the first pixel.

10. The apparatus according to claim 9, wherein the light shielding portion covers at least one of arrays each including four pixels of the plurality of pixels in the pixel area.

11. The apparatus according to claim 1, wherein the second conversion unit includes a third conversion unit and a fourth conversion unit surrounding the third conversion unit.

12. The apparatus according to claim 1,
wherein the pixel area is formed on a semiconductor substrate, and
wherein the apparatus has a laminated structure of a plurality of semiconductor substrates including the semiconductor substrate.

13. A system, comprising:
the apparatus according to claim 1; and
a processing device configured to perform processing on a signal output from the apparatus.

14. A moving body including the apparatus according to claim 1, comprising a control unit configured to control movement of the moving body by using a signal output by the apparatus.

15. An apparatus comprising a plurality of pixels,
wherein the plurality of pixels includes a pixel on which concentrated light is incident obliquely, the pixel including a first conversion unit and a second conversion unit surrounding the first conversion unit,
wherein a first center of the first conversion unit is eccentric with respect to a second center of the second conversion unit so that the first conversion unit receives a larger amount of light than an amount of light received by the first conversion unit in a case where the second center coincides with the first center,
wherein the apparatus further comprises a pixel area including the plurality of pixels arranged in the pixel area, and
wherein, as a position at which each of the plurality of pixels is arranged is closer to an edge of the pixel area, an eccentricity ratio of eccentricity increases.

16. The apparatus according to claim 15, wherein, in a pixel in which the first center is eccentric with respect to a center of the pixel, the first conversion unit is arranged so that the first center is located in an area where the obliquely incident light is concentrated.

17. The apparatus according to claim 15,
wherein the pixel area is formed on a semiconductor substrate, and
wherein the apparatus has a laminated structure of a plurality of semiconductor substrates including the semiconductor substrate.

18. A system, comprising:
the apparatus according to claim 3; and
a processing device configured to perform processing on a signal output from the apparatus.

19. A moving body including the apparatus according to claim 15, comprising a control unit configured to control movement of the moving body by using a signal output by the apparatus.

20. A substrate to be stacked on another substrate, comprising:
a pixel area including a plurality of pixels arranged in the pixel area;
a first pixel of the plurality of pixels; and
a second pixel arranged at a position closer to an edge of the pixel area than the first pixel,
wherein each of the first pixel and the second pixel includes a first conversion unit, a second conversion unit surrounding the first conversion unit, and a transistor area provided with a circuit configured to process a signal based on a charge generated in the first conversion unit and the second conversion unit,
wherein a planar distance between the first conversion unit and the transistor area in the second pixel is longer than a planar distance between the first conversion unit and the transistor area in the first pixel, and
wherein a sum of a signal obtained by multiplying a signal generated by the first conversion unit by a value corresponding to a sensitivity ratio between the first conversion unit and the second conversion unit, and a signal generated by the second conversion unit is an image signal.

21. The substrate according to claim 20,
wherein the first pixel includes a first transfer gate configured to transfer a charge from the first conversion unit, wherein the second pixel includes a second transfer gate configured to transfer a charge from the first conversion unit, and wherein the planar distance between the first conversion unit and the transistor area in the first pixel is a planar distance between the first conversion unit and the first transfer gate.

* * * * *